(12) United States Patent
Adachi

(10) Patent No.: US 7,282,890 B2
(45) Date of Patent: Oct. 16, 2007

(54) VOLTAGE DETECTOR OF BATTERY ASSEMBLY

(75) Inventor: Hideomi Adachi, Toyota (JP)

(73) Assignee: Yazaki Corporation, Tokyo (JP)

( * ) Notice: Subject to any disclaimer, the term of this patent is extended or adjusted under 35 U.S.C. 154(b) by 191 days.

(21) Appl. No.: 10/927,017

(22) Filed: Aug. 27, 2004

(65) Prior Publication Data

US 2005/0083015 A1    Apr. 21, 2005

(30) Foreign Application Priority Data

Aug. 29, 2003    (JP)    .......................... P.2003-306890

(51) Int. Cl.
*H02J 7/04* (2006.01)
*H02J 7/00* (2006.01)

(52) U.S. Cl. ...................... 320/116; 320/156; 320/134; 320/141

(58) Field of Classification Search ................ 320/116, 320/158, 155, 163; 324/426
See application file for complete search history.

(56) References Cited

U.S. PATENT DOCUMENTS 4,341,988 A * 7/1982 Small .......................... 320/158

2004/0101744 A1 * 5/2004 Suzuki .......................... 429/61

FOREIGN PATENT DOCUMENTS

| DE | 195 39 695 C2 | 5/1998 |
|---|---|---|
| DE | 100 51 984 C2 | 4/2003 |
| JP | 9-159701 A | 6/1997 |
| JP | 2000-277174 A | 10/2000 |
| JP | 2002-8734 A | 1/2002 |
| JP | 2000-134818 A | 5/2002 |
| JP | 2002-315212 A | 10/2002 |

* cited by examiner

*Primary Examiner*—Bao Q. Vu
*Assistant Examiner*—Alexis Boateng
(74) *Attorney, Agent, or Firm*—Sughrue Mion Pllc.

(57) ABSTRACT

A voltage detector for a battery assembly having unit cells, the voltage detector includes a low voltage system circuit and a high voltage system circuit. The low voltage system circuit includes an enable pulse output unit which outputs an enable pulse to command detection of a voltage across both terminals of the unit cell. The high voltage system circuit includes a voltage pulse output unit which output a voltage pulse showing a voltage across both terminals of the unit cell, a switch which is provided between each unit cell of the battery assembly and the voltage pulse output unit and a switch controller which conducts ON-OFF control of the switch so that the each unit cell is successively connected to the voltage pulse output unit according to the enable pulse inputted from the pulse output unit.

6 Claims, 6 Drawing Sheets

VOLTAGE DETECTOR OF BATTERY ASSEMBLY

BACKGROUND OF THE INVENTION

The present invention is related to a voltage detector of a battery assembly. More particularly, the present invention is related to a voltage detector of a battery assembly for detecting a voltage across both terminals of each unit cell of the battery assembly in which a plurality of unit cells comprised of batteries are connected to each other.

For the power source of an electric car, a battery assembly is used in which a plurality of unit cells comprised of batteries are connected in series or parallel to each other so that the battery assembly can have a necessary large capacity. As a voltage detector to detect the voltage across both terminals of each cell of the above battery assembly, for example, the resistance type potential dividing voltage detector shown in FIG. 6A is known. Concerning this type voltage detector, for example, refer to JP-A-2000-134818.

In the resistance type potential dividing voltage detector shown in FIG. 6A, switches are successively turned on in the order of switches $S_1$ and $S_4 \rightarrow$ switches $S_2$ and $S_4 \rightarrow$ switches $S_3$ and $S_4$. Due to the foregoing, both end potions of unit cell $V_1$ are connected to the potential dividing circuit composed of resistors $R_1$ and $R_4$ both end portions of unit cell $V_2$ are connected to the potential dividing circuit composed of resistors $R_2$ and $R_5$, and both end portions of unit cell $V_3$ are connected to the potential dividing circuit composed of resistors $R_3$ and $R_6$ in this order.

According to potential dividing outputs $V_1'$, $V_2'$ and $V_3'$ of these potential dividing circuits, the controller 4 can detect the voltages across both terminals of the units cells $V_1$ to $V_3$. This controller is supplied with electric power from the low voltage power source of 5 V which is different from the battery assembly. Further, this controller is connected to the ground line which is different from the ground line of the battery assembly. In the resistance type potential dividing voltage detector described above, when values of resistors $R_1$ to $R_6$, which are potential dividing resistors, are made to be high, it is possible to substantially insulate the low voltage system controller 4 and the battery assembly from each other.

However, in the above resistance type potential dividing voltage detector, the controller 4 is connected to the battery assembly via switches $S_1$ to $S_4$. Therefore, it is impossible to attain a perfect insulation between the controller 4 and the battery assembly.

Concerning the voltage detector capable of attaining a perfect insulation between the controller and the battery assembly, the flying capacitor type voltage detector shown in FIG. 6B is known. Concerning this voltage detector, refer to JP-A-2002-15212. In the flying capacitor type voltage detector shown in FIG. 6B, switches are successively turned on in the order of switches $S_7$ and $S_8 \rightarrow$ switches $S_8$ and $S_9 \rightarrow$ switches $S_9$ and $S_{10}$.

Due to the foregoing, both end portions are connected to capacitor C in the order of unit cell $V_1 \rightarrow V_2 \rightarrow V_3$. According to the voltage across both terminals of capacitor C which has been electrically charged by unit cells $V_1$ to $V_3$, the controller 4 detects the voltages across both terminals of unit cells $V_1$ to $V_3$. In this connection, when the voltage across both terminals of capacitor C is detected, switches $S_{11}$ and $S_{12}$ are turned on, and the voltage across both terminals of capacitor C is outputted into the controller 4. At this time, when the battery assembly and capacitor C are separated from each other by turning off switches $S_7$ to $S_{10}$, the battery assembly and the controller 47 can be insulated from each other.

However, in the above flying capacitor type voltage detector, switches $S_7$ to $S_{12}$ are turned on and off by the controller 4 in the low voltage system. Therefore, in order to insulate the battery assembly and the controller 4 from each other, it is necessary to use such a switch as a photo-MOS, which is turned on and off when an optical signal is inputted, for switches $S_7$ to $S_{12}$. In this case, the manufacturing cost is raised. Therefore, for example, if switches $S_7$ to $S_{12}$ are controlled by a logic circuit in the high voltage system to which electric power is supplied from the battery assembly, it becomes unnecessary to use the photo-MOS. However, in this structure, switches $S_7$ to $S_{12}$ can not insulate the battery assembly and the controller 4 from each other.

In the resistance type potential dividing voltage detector shown in FIG. 6A, detection errors may be caused due to the deviation of resistors $R_1$ to $R_6$ which are the potential dividing resistors connected to the unit cells $V_1$ to $V_3$. These resistors $R_1$ to $R_6$ also deviate according to a change in the ambient temperature.

On the other hand, in the flying capacitor type voltage detector shown in FIG. 6B, when a common capacitor C is connected to the unit cells $V_1$ to $V_3$, it is possible to eliminate detection errors which are caused by the deviation of capacitors C connected to each unit cell $V_1$ to $V_3$. However, even in the case of the above capacitor C, its capacity deviates due to the ambient temperature in the same manner as resistors $R_1$ to $R_6$. Due to the foregoing, detection errors may be caused.

SUMMARY OF THE INVENTION

Therefore, in order to solve the above problems, it is a first object of the present invention to provide a voltage detector capable of insulating a battery assembly and a low voltage system circuit from each other without using an expensive switch such as a photo-MOS.

It is a second object of the present invention to provide a voltage detector capable of detecting a voltage across both terminals of the unit cell with high detection accuracy.

In order to accomplish the first object described above, the invention provides a voltage detector for a battery assembly having a plurality of unit ills which are connected to each other, the voltage detector comprising:

a low voltage system circuit, which is supplied with electric power from a low voltage power source different from the battery assembly, the low voltage system circuit including:

an enable pulse output unit, which outputs an enable pulse to command detection of a voltage across both terminals of the unit cell; and a high voltage system circuit, which is supplied with electric power from the battery assembly, the high voltage system circuit including:

a voltage pulse output unit, which output a voltage pulse showing a voltage across both terminals of the unit cell;

a switch, which is provided between each unit cell of the battery assembly and the voltage pulse output unit; and a switch controller, which conducts ON-OFF control of the switch so that the each unit cell is successively connected to the voltage pulse output unit according to the enable pulse inputted from the pulse output unit.

According to the above configuration, in the low voltage system circuit, the enable pulse output unit outputs an enable pulse to command to detect a voltage across both terminals of the unit cell. The enable pulse is inputted into the high voltage system circuit. According to the input of the enable pulse, the switch controller of the high voltage system turns on and off the switch provided between each unit cell and the voltage pulse output unit so that the unit cells can be successively connected to the voltage pulse output unit. When the unit cell is connected to the voltage pulse output unit, the voltage pulse output unit outputs a voltage pulse showing a voltage across both terminals of the connected unit cell. The voltage pulse is inputted into the low voltage system circuit.

When the switch controller is provided in the high voltage system circuit, it becomes unnecessary to insulate the switch and the switch controller from each other. Therefore, it becomes unnecessary to use an expensive switch such as a photo-MOS for the switch. Further, signals are sent and received between the high voltage system circuit and the low voltage system circuit by pulses. Therefore, when a photo-MOS or relay switch is used, even if the switch controller is provided in the high voltage system circuit, the battery assembly and the low voltage system circuit can be insulated from each other.

Preferably, the voltage pulse output unit outputs a voltage pulse according to a period of time from the start of integration of one of a first voltage and a second voltage to when a value of integration of the one of the first voltage and the second voltage becomes equal to an integration value obtained when the other of the first voltage and the second voltage is integrated for a predetermined period of time. The first voltage is a voltage across both terminals of the unit cell. The second voltage is a reference voltage.

In the above configuration, the voltage pulse output unit outputs a voltage pulse according to a period of time from the start of integration of one of the voltage across both terminals of the unit cell and the previously determined reference voltage to when a value of integration of the one of the voltage across both terminals of the unit cell and the previously determined reference voltage becomes equal to an integration value obtained when the other is integrated for a predetermined period of time. Accordingly, when the voltage across both terminals of the unit cell is found according to this voltage pulse, it is possible to eliminate an influence of the detection error caused by the deviation of the voltage pulse output unit connected to each unit cell. Therefore, the voltage across both terminals of the unit cell of which can be highly accurately detected.

Preferably, the voltage pulse output unit has an integration circuit to integrate an input voltage. The switch changes the input voltage of the integration circuit between the first voltage and the second voltage which is a reverse polarity with respect to the first voltage. The switch controller controls so as to inputs the other of the first voltage and the second voltage after inputting one of the first voltage and the second voltage for a predetermined period of time. The voltage pulse output unit outputs a voltage pulse according to a period of time from when the input of the integration circuit is changed from one to the other to when an output of the integration circuit becomes equal to the output of the integration circuit before the one is inputted.

In the above configuration, the switch can change over the input voltage of the integration circuit between the voltage across both terminals of the unit cell and the reference voltage, the polarity of which is inverse to that of the voltage across both terminals. The switch controller inputs one of the voltage across both terminals of the unit cell and the reference voltage for a predetermined period of time and then inputs the other. The voltage pulse output unit outputs a voltage pulse according to the period of time from when the input of the integration circuit is changed over from one to the other to when the output of the integration circuit becomes equal to the output of the integration circuit before the one is inputted. Accordingly, when the polarity of the reference voltage is made to be opposite to the polarity of the voltage across both terminals of the unit cell, the voltage pulse can be outputted by using one integration circuit. Therefore, it is possible to obtain a voltage detector of the battery assembly, the manufacturing cost of which is reduced.

Preferably, the voltage pulse output unit outputs a voltage pulse of either level H or L for a period of time from when the input of the integration circuit is changed from one to the other to when the output of the integration circuit becomes equal to the output of the integration circuit before one is inputted. The low voltage system circuit further includes a count pulse generator which generates a count pulse while a voltage pulse of either level H or L is outputted.

In the above configuration, the voltage pulse output unit outputs a voltage pulse of level H or L for a period of time from when the input of the integration circuit is changed over from one to the other to when the output of the integration circuit becomes equal to the output of the integration circuit before one is inputted. The low voltage circuit further includes a count pulse generator for generating a count pulse while a voltage pulse of level H or L is being outputted. Accordingly, when the count pulse generator is provided in the low voltage system circuit, for example, compared with a case in which the count pulse generator is provided in the high voltage system circuit and a count pulse outputted from the count pulse generator is made to be a voltage pulse, the number of outputting the voltage pulse can be decreased.

Preferably, the high voltage system circuit further includes a counter which counts the predetermined period of time.

In the above configuration, the high voltage circuit further includes a counter for counting the predetermined period of time. Accordingly, when the counter is provided in the high voltage system circuit, it becomes unnecessary to insulate the counter and the voltage pulse output unit in the high voltage circuit from each other. Therefore, it is possible to provide a voltage detector of the battery assembly, the manufacturing cost is reduced.

According to the present invention, there is also provided a voltage detector for a battery assembly having a plurality of unit cells which are connected to each other, the voltage detector comprising:

a detector, which detects a voltage across both terminals of the unit cell according to a period of time from the start of integration of one of a first voltage and a second voltage to when a value of integration of the one of the first voltage and the second voltage becomes equal to an integration value obtained when the other of the first voltage and the second voltage is integrated for a predetermined period of time, wherein the first voltage is a voltage across the both terminals of the unit cell; and wherein the second voltage is a reference voltage.

In the above configuration, the voltage detector provides a voltage detector of a battery assembly for detecting a voltage across both terminals of a unit cell of a battery assembly in which a plurality of unit cells comprised of batteries are connected to each other, wherein the voltage across both terminals is detected according to a period of time from the start of integration of one of the voltage across both terminals of the unit cell and the previously determined reference voltage to when a value of integration of the one of the voltage across both terminals of the unit cell and the previously determined reference voltage becomes equal to an integration value obtained when the other is integrated for a predetermined period of time. Accordingly, when the voltage across both terminals of the unit cell is found according to the period of time in which both become equal to each other, an influence of the detection error caused by the deviation of the detection element connected to the unit cell can be eliminated. Accordingly, it is possible to provide a voltage detector in which the accuracy of detecting the voltage across both terminals of the unit cell can be enhanced.

Preferably, the voltage detector further comprising:

an integration circuit, which integrates an input voltage;

a switch, which changes the input voltage of the integration circuit between the first voltage and the second voltage which is a reverse polarity with respect to the first voltage; and a switch controller, which control so as to change the input between the first voltage and the second voltage, wherein the switch controller change one of the first voltage and the second voltage to the other of the first voltage and the second voltage after the one is inputted for a predetermined period of time; and wherein the first voltage is detected according to a period of time from when one of the first voltage and the second voltage is changed to the other of the first voltage and the second voltage to when the output of the integration circuit becomes equal to the output of the integration circuit before the one is inputted.

In the above configuration, the switch changes over the input voltage of the integration circuit between the voltage across both terminals of the unit cell and the reference voltage, the polarity of which is inverse to that of the voltage across both terminals. The switch controller inputs one of the voltage across both terminals of the unit voltage and the reference voltage for a predetermined period of time and then inputs the other. The voltage across both terminals is detected according to a period of time from when one is changed over to the other to when the output of the integration circuit becomes equal to the output of the integration circuit before one is inputted. Accordingly, when the polarity of the reference voltage is made to be inverse to the polarity of the voltage across both terminals of the unit cell, the voltage across both terminals can be detected by using one integration circuit.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
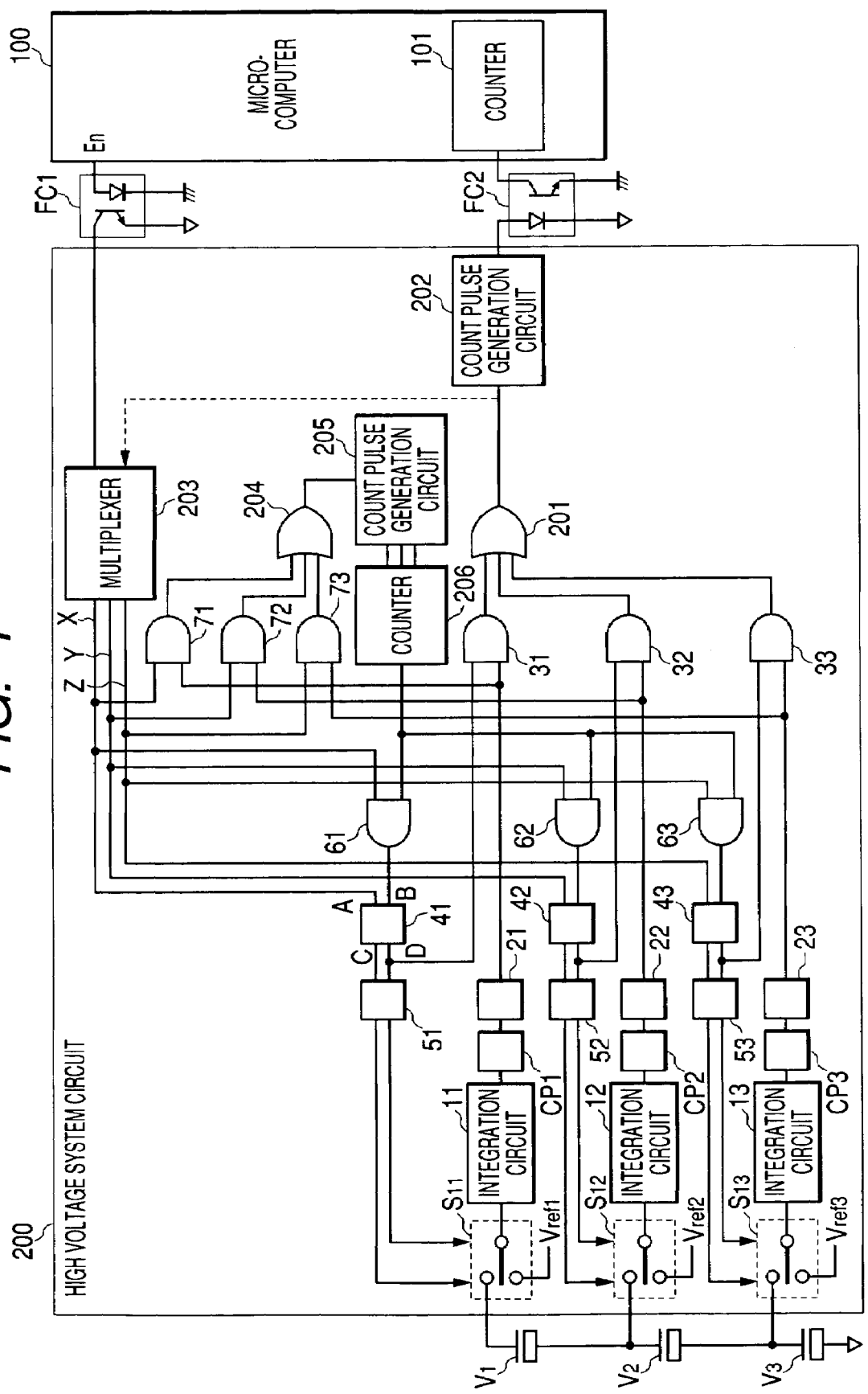
FIG. 1 is a circuit diagram showing a first embodiment of the voltage detector of the present invention.

The present invention will be explained below, referring to the drawings. FIG. 1 is a circuit diagram showing a first embodiment of the voltage detector of the battery assembly of the present invention.

A voltage detector of the battery assembly, which will be referred to as a voltage detector hereinafter, is a device for detecting a voltage across both terminals of each unit cell of a battery assembly mounted on a vehicle in which a plurality of unit cells composed of batteries are connected to each other. In this embodiment, in order to simplify the explanations, a voltage detector will be explained here which detects voltages across both terminals of three unit cells $V_1$ to $V_3$, wherein each unit cell is comprised of one battery.

As shown in FIG. 1, the voltage detector includes: a microcomputer 100 which serves to a low voltage system circuit; and a high voltage system circuit 200. The microcomputer 100 is operated by electric power supplied from a low voltage power source different from the battery assembly. This microcomputer 100 is grounded to a vehicle body. On the other hand, the high voltage system circuit 200 is operated by electric power supplied from the battery assembly comprised of unit cells $V_1$ to $V_3$. This high voltage system circuit 200 is insulated from the vehicle body earth.

The microcomputer 100 serves to an enable pulse output unit. Therefore, the microcomputer 100 outputs an enable pulse $E_n$ which commands to detect the voltage across both terminals of the unit cells $V_1$ to $V_3$. The above high voltage system circuit 200 has a voltage pulse output circuit including: integration circuits 11 to 13; comparators CP1 to CP3; level shifters 21 to 23; AND gates 31 to 33; OR gate 201; and a counter pulse generation circuit 202. This voltage pulse output circuit serves to the voltage pulse output unit.

Further, the high voltage system circuit 200 includes switches $S_{11}$ to $S_{13}$ provided between the unit cells $V_1$ to $V_3$ and the integration circuits 11 to 13. These switches $S_{11}$ to $S_{13}$ can change over the input voltage, which is inputted into the integration circuits 11 to 13, between the voltages across both terminals of the unit cells $V_1$ to $V_3$ and the reference voltages $V_{ref1}$ to $V_{ref3}$, the polarities of which are opposite to the polarities of the voltages across both terminals.

Further, the high voltage circuit 200 has a switch control circuit including: a multiplexer 203; logic circuits 41 to 43; reverse shifts 51 to 53; AND gates 61 to 63; AND gates 71 to 73; an OR gate 204; a counter pulse generation circuit 205; and a counter 206. This switch control circuit serves to a switch controller.

Figure 2:
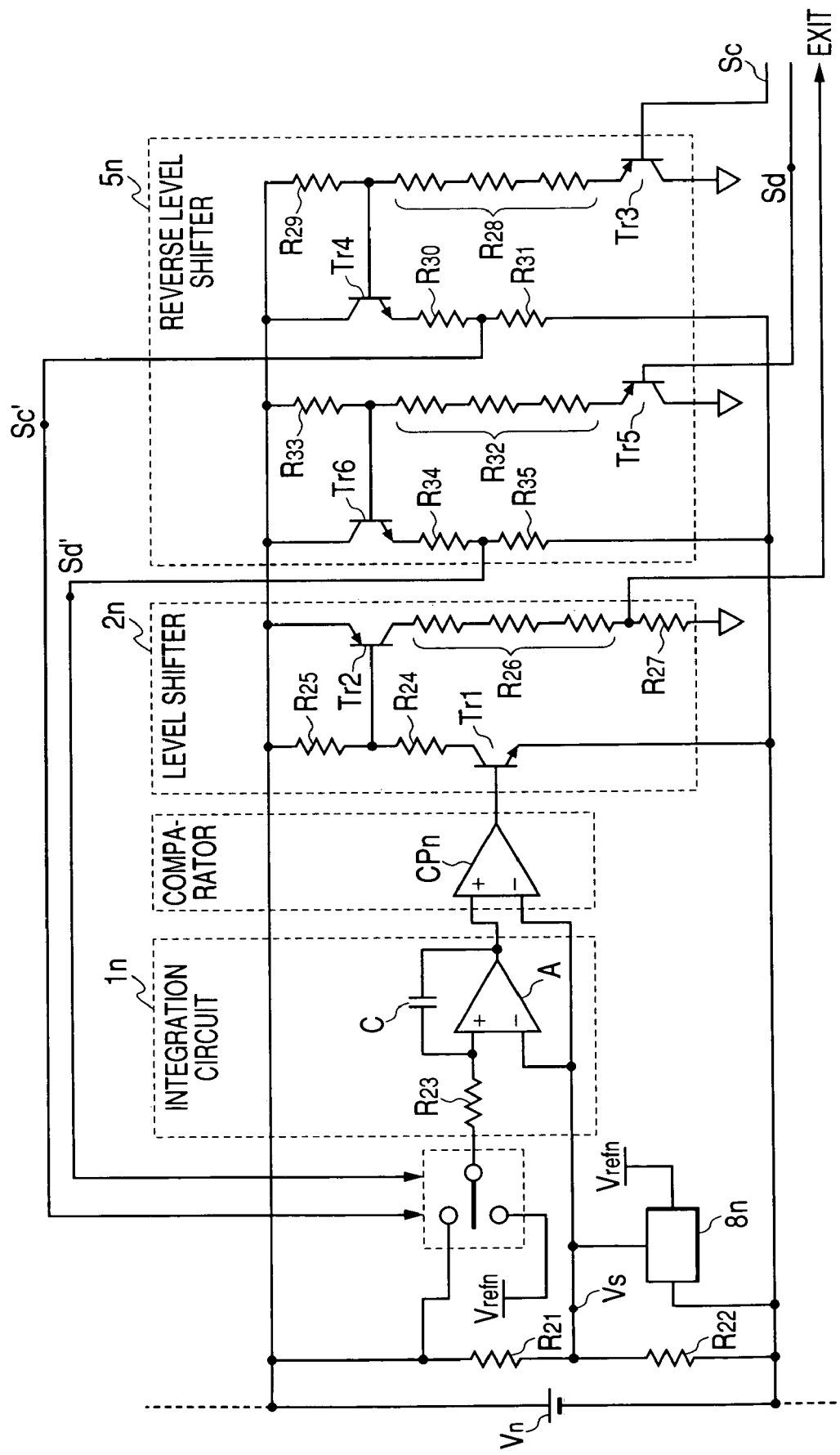
FIG. 2 is a view showing the detailed constitution of switch $S_{1n}$, integration circuit $1_n$, comparator $CP_n$, level shifter $2_n$ and reverse level shifter $5_n$ for arbitrary unit cell $V_n$.

Next, referring to FIG. 2, the constitution of the high voltage system circuit 200 described above will be explained in detail as follows. In FIG. 2, switch $S_{1n}$, integration circuit $1_n$, comparator $CP_n$, level shifter $2_n$ and reverse level shifter $5_n$ for an arbitrary unit cell $V_n$ are shown in detail.

As shown in FIG. 2, a switch $S_{1n}$ can change over the input voltage of the integration circuit $1_n$ between the voltage across both terminals of unit cell $V_n$ and reference voltage $V_{refn}$. This reference voltage $V_{refn}$ is supplied from the constant voltage power source $8_n$ which is arranged between the connection point of resistors $R_{21}$, $R_{22}$, which are connected to the unit cell $V_n$ in series, and the negative side of the unit cell $V_n$.

The above integration circuit $1_n$ is constituted by an OP amplifier A. Resistor $R_{23}$ is connected between the positive input end of this OP amplifier A and the switch $S_{1n}$. Condenser C is connected between the positive input end and the output end of the OP amplifier A. The negative input end of OP amplifier A is supplied with the potential dividing value $V_s$ obtained when the voltage across both terminals of unit cell $V_n$ is divided by resistors $R_{21}$ and $R_{22}$.

An output of the integration circuit $1_n$ is supplied to the positive input end of comparator $CP_n$. The negative input end of this comparator $CP_n$ is supplied with the potential dividing value $V_s$. Accordingly, when an output of the integration circuit $1_n$ has become lower than the potential dividing value $V_s$, this comparator $CP_n$ outputs a signal of level H. Further, the output of this comparator $CP_n$ is supplied to the level shifter $2_n$.

The level shifter $2_n$ includes: transistor $T_r1$ in which an output of the comparator $CP_n$ is inputted into the base, the positive side of unit cell $V_n$ is connected to the collector via resistors $R_{24}$, $R_{25}$ and the negative side of unit cell $V_n$ is connected to the emitter, and transistor $T_r2$ in which a connection point of resistors $R_{24}$, $R_{25}$ is connected to the base, the positive side of unit cell $V_n$ is connected to the collector, and the earth, which is different from the body earth, is connected to the emitter via the resistor groups $R_{26}$ and $R_{27}$.

Accordingly, when a signal of level H is outputted from comparator $CP_n$ and inputted into the level shifter $2_n$, transistors $T_r1$ and $T_r2$ are turned on. Due to the foregoing, the level shifter $2_n$ outputs a signal in which a signal of level H of comparator $CP_n$ is level shifted to a potential dividing value obtained when the positive side voltage of unit cell $V_n$ is potentially divided by resistor groups $R_{26}$ and $R_{27}$.

The reverse level shifter $5_n$ is provided between unit cells $V_n$. This reverse level shifter $5_n$ is inputted with ON-signal $S_c$, which is outputted from terminal C of the logic circuit $4_n$, and ON-signal $S_d$ which is outputted from terminal D. This reverse level shifter $5_n$ includes: transistor $T_r3$ in which ON-signal $S_c$ is inputted into the base, the positive side of unit cell $V_n$ is connected to the collector via resistor groups $R_{28}$, $R_{29}$, and the earth is connected to the emitter; and transistor $T_r4$ in which the connection point of resistor groups $R_{28}$ and $R_{29}$ is connected to the base, the positive side of unit cell $V_n$ is connected to the collector, and the negative side of unit cell $V_n$ is connected to the emitter via resistors $R_{30}$ and $R_{31}$.

Further, the reverse level shifter $5_n$ includes: transistor $T_r5$ in which ON-signal $S_d$ is inputted into the base, the positive side of unit cell $V_n$ is connected to the collector via resistor groups $R_{32}$ and $R_{33}$, and the earth is connected to the emitter, and transistor $T_r6$ in which the connection point of resistor groups $R_{32}$ and $R_{33}$ is connected to the base, the positive side of unit cell $V_n$ is connected to the collector, and the negative side of unit cell $V_n$ is connected to the emitter via resistors $R_{34}$ and $R_{35}$.

Accordingly, when ON-signal $S_c$ is outputted and inputted into the reverse level shifter $5_n$, transistors $T_r3$ and $T_r4$ are turned on. Due to the foregoing, the reverse level shifter $5_n$ outputs ON-signal $S_c$ obtained when ON-signal $S_c$ is level-shifted to a potential dividing value in which the voltage across both terminals of unit cell $V_n$ is divided by resistor $R_{30}$ and resistor $R_{31}$.

On the other hand, when ON-signal $S_d$ is outputted and inputted into the reverse level shifter $5_n$, transistors $T_r5$ and $T_r6$ are turned on. Due to the foregoing, the reverse level shifter $5_n$ outputs ON-signal $S_d$ obtained when ON-signal $S_d$ is level-shifted to a potential dividing value in which a voltage across both terminals of unit cell $V_n$ is divided by resistor $R_{34}$ and resistor $R_{35}$.

Next explanations will be made into the principle of detection of detecting the voltages across both terminals of unit cells $V_1$ to $V_3$ by the voltage pulse output circuit. Potential dividing value $V_s$ is supplied to the negative input end of OP amplifier A composing the integration circuit $1_n$. Therefore, when no input is given to the integration circuit $1_n$, an output of the integration circuit $1_n$ becomes equal to the potential dividing value $V_s$.

Next, when switch $S_{1n}$ is operated and the voltage across both terminals $V_{IN}$ of unit cell $V_n$ is inputted into the integration circuit in for a predetermined period of time $T_1$, the integration circuit $1_n$ starts the integration of the voltage across both terminals $V_{IN}$. Due to the foregoing, the output of the integration circuit $1_n$ decreases from the potential dividing value $V_s$ by the integration value $\int V_{IN} dT$ of the voltage across both terminals. After the above predetermined period of time $T_1$ has passed, the integration value $\int V_{IN} dT_1$ of the voltage $V_{IN}$ across both terminals becomes $\{V_{IN} \times T_1 / (R_{23} \times C)\}$. Therefore, the output of the integration circuit $1_n$ is a value which is subtracted the integration value $\int V_{IN} dT_1 = \{V_{IN} \times T_1 / (R_{23} \times C)\}$ from the potential dividing value $V_s$.

Next, when switch $S_{1n}$ is operated and reference voltage $V_{refn}$, the polarity of which is opposite to the polarity of the voltage across both terminals $V_{IN}$ of unit cell $V_n$, is inputted into the integration circuit $1_n$, the integration circuit $1_n$ starts the integration of reference voltage $V_{refn}$. When reference voltage $V_{refn}$ of the opposite polarity is integrated, an output of the integration circuit $1_n$ is increased by the integration value $\int V_{refn} dT$ of reference voltage $V_{refn}$. Then, time $T_2$ is measured which is from when reference voltage $V_{refn}$ is inputted to when the output of the integration circuit $1_n$ becomes equal to the potential dividing value $V_{sn}$ again.

The integration value $\int V_{refn} dT_2$ of reference voltage $V_{refn}$ becomes $V_{refn} \times T_2 / (R_{23} \times C)$ in the above measuring time $T_2$. Accordingly, since the integration value $\int V_{IN} dT_1$ and the integration value $\int V_{refn} dT_2$ are equal to each other, the following relational expression (1) is established.

$$V_{IN} \times T_1 / (R_{23} \times C) = V_{refn} \times T_2 / (R_{23} \times C) \quad (1)$$

The following relational expression (2) can be introduced from the above relational expression (1).

$$V_{IN} = V_{refn} \times (T_2 / T_1) \quad (2)$$

Accordingly, since the above reference voltage $V_{refn}$ and predetermined period of time $T_1$ have already been known, when time $T_2$ is measured, it is possible to detect the voltage $V_{IN}$ across both terminals of unit cell $V_n$.

In the end, in the present embodiment, the voltage across both terminals can be detected according to time $T_2$ from when the integration of reference voltage $V_{refn}$ is started to when the integration value $\int V_{refn} dT$ becomes equal to the integration value $\int V_{IN} dT_1$ which is obtained when the voltage across both terminals $V_{IN}$ of unit cell $V_n$ is integrated for a predetermined period of time $T_1$. When the voltage across both terminals is detected according to time $T_2$ as described above, as can be understood in the above expression (2), it is possible to obtain the voltage $V_{IN}$ across both terminals without using resistor $R_{23}$ and condenser C composing the integration circuit $1_n$. Therefore, it is possible to eliminate an influence of the detection error caused by the deviation of the detection element such as the integration circuit $1_n$ connected to the unit cell $V_n$.

When an input of the integration circuit $1_n$ is changed over between the voltage across both terminals of unit cell $V_n$ and reference voltage $V_{refn}$, the polarity of which is opposite to the polarity of the voltage across both terminals, it is possible to measure time $T_2$ by using one integration circuit $1_n$.

Operation of the voltage detector, which has been briefly explained above, will be explained in detail as follows, referring to the flow chart shown in FIG. 3. First, the microcomputer 100 outputs an enable pulse $E_n$ ((a) of FIG. 3). Enable pulse $E_n$ is converted into an optical pulse by photo coupler FC1 and supplied to the high voltage system circuit 200. Enable pulse $E_n$, which has been supplied via photo coupler FC1, is supplied to the multiplexer 203. The multiplexer 203 outputs a signal of level H from the terminal X according to a rise of enable pulse $E_n$.

Figure 3:
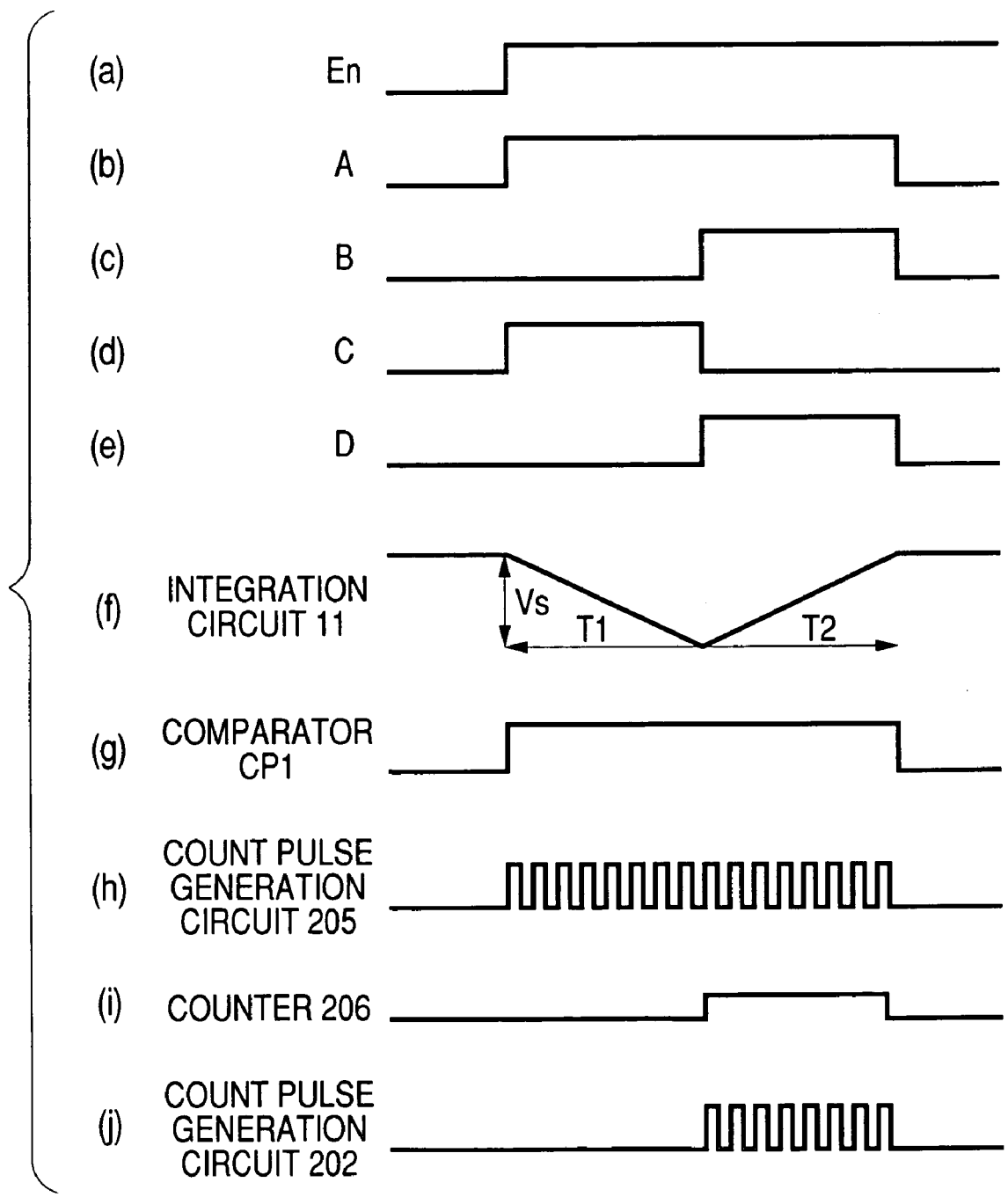
FIG. 3 is a time chart of various signals in the high voltage system circuit 200.

Due to the foregoing, terminal A of the logic circuit 41 is supplied with a signal of level H ((b) of FIG. 3), and terminal B is supplied with a signal of level L ((c) of FIG. 3). When terminal A is inputted with the signal of level H, and terminal B is inputted with the signal of level L, the logic circuit 41 outputs ON signal $S_c$ of level H from terminal C ((d) of FIG. 3). After ON signal $S_c$ is level-shifted by the reverse level shifter 51, it is inputted into switch $S_{11}$.

Due to the foregoing, the voltage across both terminals of unit cell $V_1$ is inputted into the integration circuit 11 from switch $S_{11}$. As described above, by the input of the voltage across both terminals of unit cell $V_1$, an output of the integration circuit $1_n$ is reduced lower than the potential dividing value $V_s$ ((f) of FIG. 3). Therefore, an output of comparator CP1 becomes level H ((g) of FIG. 3).

According to level H of comparator CP1, both input ends of AND gate 71 become level H. Therefore, a signal of level H is supplied to the counter pulse generation circuit 205 via OR gate 204. According to the supply of this signal of level H, the counter pulse generation circuit 205 outputs a counter pulse ((h) of FIG. 3). Then, the counter 206 counts the number of count pulses. When the number of pulses corresponding to predetermined time $T_1$ is counted, a signal of level H is outputted ((i) of FIG. 3). Accordingly, both input ends of AND gate 61 are supplied with the signal of level H. Therefore, the signal of level H is also supplied to terminal B of the logic circuit 41 (FIG. 3(c)).

According to the supply of the signal of level H to the logic circuit 41, the logic circuit 41 stops outputting ON signal $S_o$ from terminal C (FIG. 3(d)). At the same time, the logic circuit 41 outputs ON signal $S_d$ from terminal D ((e) of FIG. 3). After ON signal $S_d$ has been level-shifted by the reverse level shifter 51, it is inputted into switch $S_{11}$. Due to the foregoing, reference voltage $V_{refl}$ is inputted into the integration circuit 11 from switch $S_{11}$.

When ON signal $S_d$ is outputted, both input ends of AND gate 31 becomes level H. Therefore, the signal of level H is supplied to the count pulse generation circuit 202 via OR gate 201. According to the supply of the signal of level H, the counter pulse generation circuit 202 outputs a counter pulse ((j) of FIG. 3).

When predetermined period of time $T_1$ has passed after the voltage across both terminals of unit cell $V_1$ is inputted into the integration circuit 11, switch $S_{11}$ is changed over, and reference voltage $V_{refl}$ is inputted into the integration circuit 11 and a count pulse is outputted from the counter pulse generation circuit 202.

According to the input of reference voltage $V_{refl}$, an output of the integration circuit 11 is increased (Refer to (f) of FIG. 3). When the output of the integration circuit 11 exceeds the potential dividing value $V_s$ again by the increase of the output, an output of comparator CP1 becomes level L ((g) of FIG. 3). According to level L of comparator CP1, AND gate 31 also outputs a signal of level L. This signal of level L is supplied to the count pulse generation circuit 202 via OR gate 201. Due to the foregoing, the count pulse generation circuit 202 stops outputting the count pulse ((j) of FIG. 3).

In the end, the count pulse generation circuit 202 outputs count pulses for period of time $T_2$ from when the input voltage of the integration circuit 11 is changed over from the voltage across both terminals of unit cell $V_1$ to reference voltage $V_{refn}$ to when the output of the integration circuit 11 becomes equal to output $V_s$ of the integration circuit 11 before the voltage across both terminals of unit cell $V_1$ is inputted. This count pulse is supplied to the counter 101 in the microcomputer 200 via the photo-coupler FC2.

An output of OR gate 201 is connected to the multiplexer 203. Each time the output of OR gate 201 falls down, the multiplexer 203 outputs a signal of level H in the order of terminals X and Y. Due to the foregoing, concerning unit cells $V_2$ and $V_3$, the count pulse can be outputted in the same manner. Therefore, time $T_2$ can be grasped on the microcomputer 100 side, and the voltage across both terminals can be detected.

According to the voltage detector described above, when the switch control circuit to control switches $S_{11}$ to $S_{13}$ is provided in the high voltage system circuit 200, it becomes unnecessary to insulate switches $S_{11}$ to $S_{13}$ and the switch control circuit from each other. Accordingly, it is unnecessary to use such an expensive switch as a photo-MOS. Further, signals can be sent and received between the high voltage system circuit 200 and the low voltage system circuit 100 with optical pulses by using photo-couplers FC1 and FC2. Therefore, even if the switch control circuit is provided in the high voltage system circuit 200, it is possible to insulate the battery assembly and the low voltage system circuit 100 from each other. Accordingly, the battery assembly and the low voltage system circuit 100 can be insulated from each other without using such an expensive switch as a photo-MOS.

In the first embodiment, enable pulse $E_n$ and the count pulses are converted into optical pulses by using photo-couplers FC1 and FC2. However, for example, when relay switches are used, it is possible to insulate the low voltage system circuit 100 and the high voltage system circuit 200 from each other.

Figure 4:
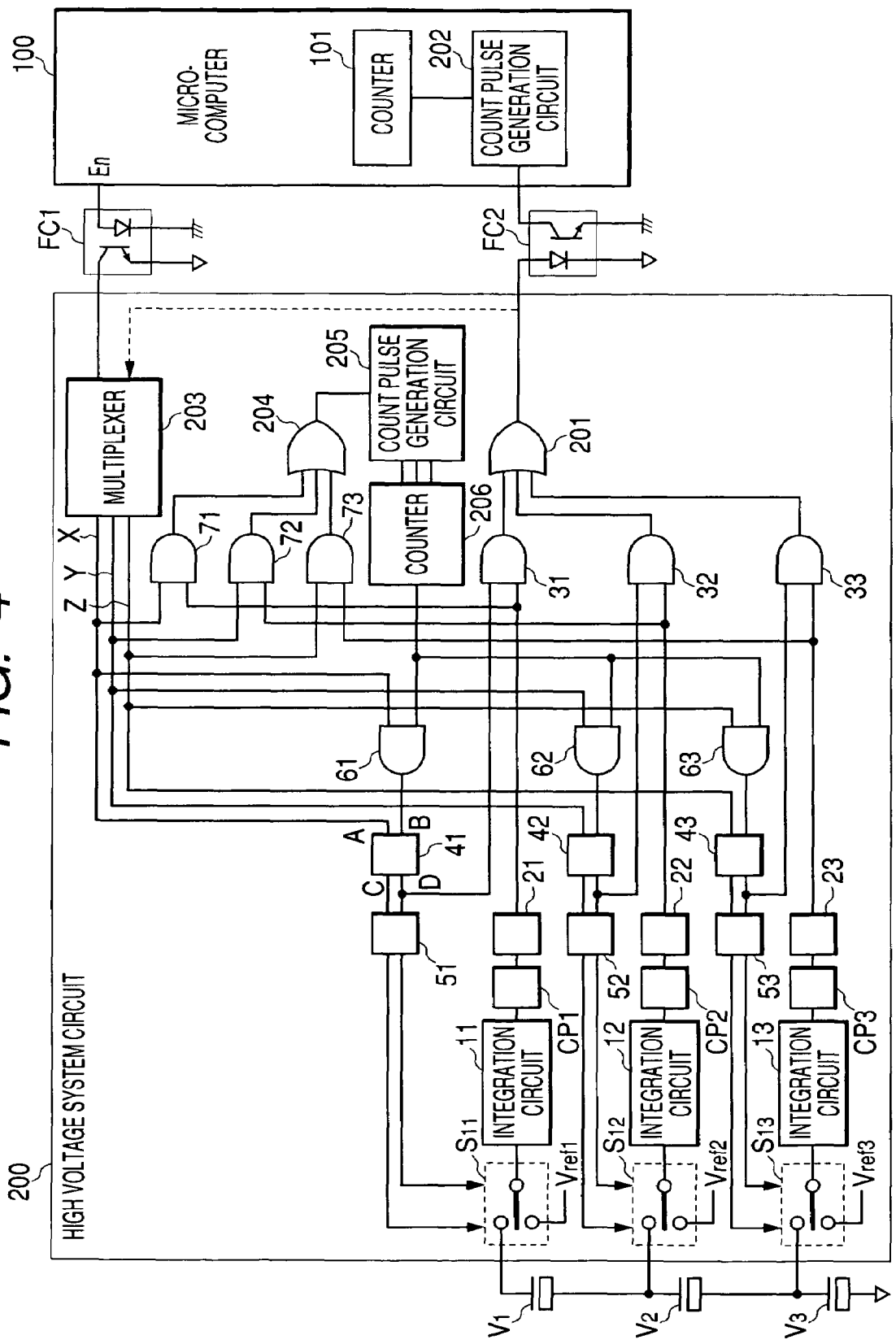
FIG. 4 is a circuit diagram showing a voltage detector of the battery assembly of a second embodiment of the present invention.

In the first embodiment, the count pulse generation circuit 202 outputs a voltage pulse and is provided on the high voltage system circuit 200 side. However, in the second embodiment, it can be considered that the count pulse generation circuit 202 is provided on the microcomputer 100 side as shown in FIG. 4. In this case, the number of times of lighting photo-coupler FC2 is decreased. Therefore, the deterioration of photo-coupler FC2 can be delayed.

Figure 5:
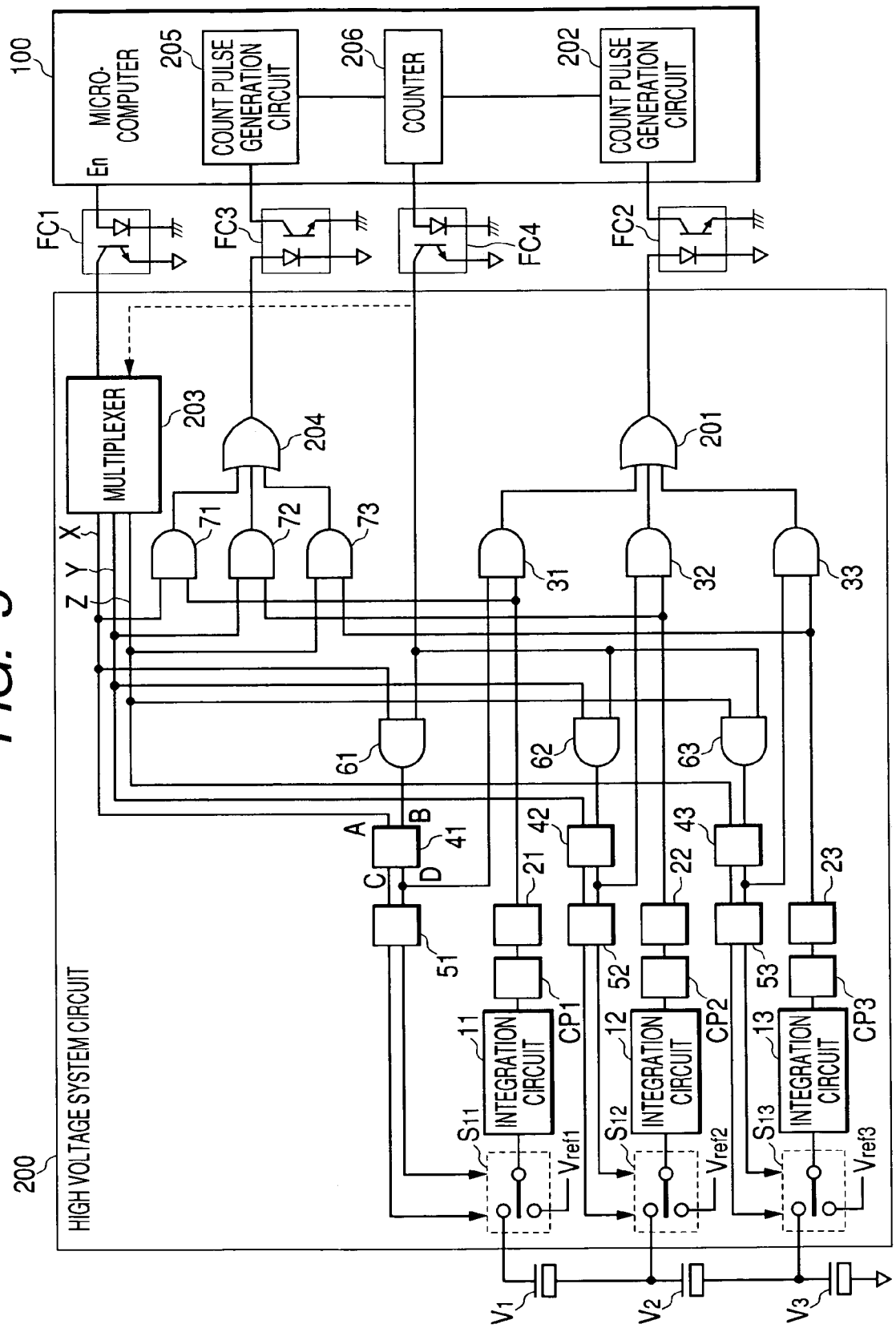
FIG. 5 is a circuit diagram showing a voltage detector of the battery assembly of a third embodiment of the present invention.
Figure 6A:
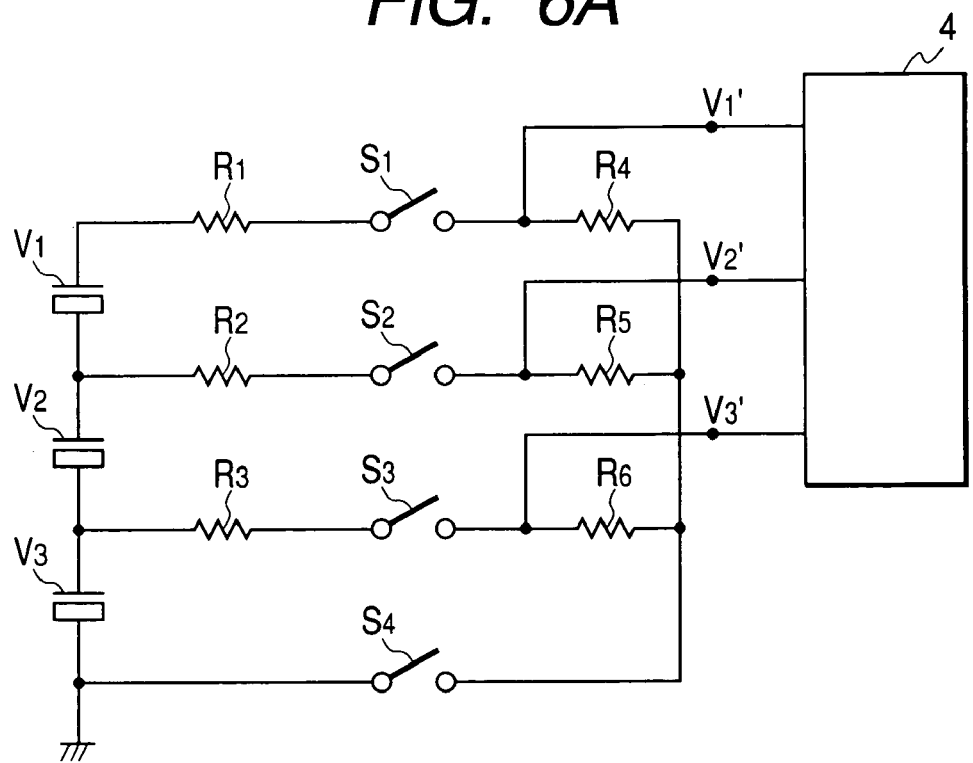
FIG. 6A is a circuit diagram showing an example of the potential dividing type voltage detector.
Figure 6B:
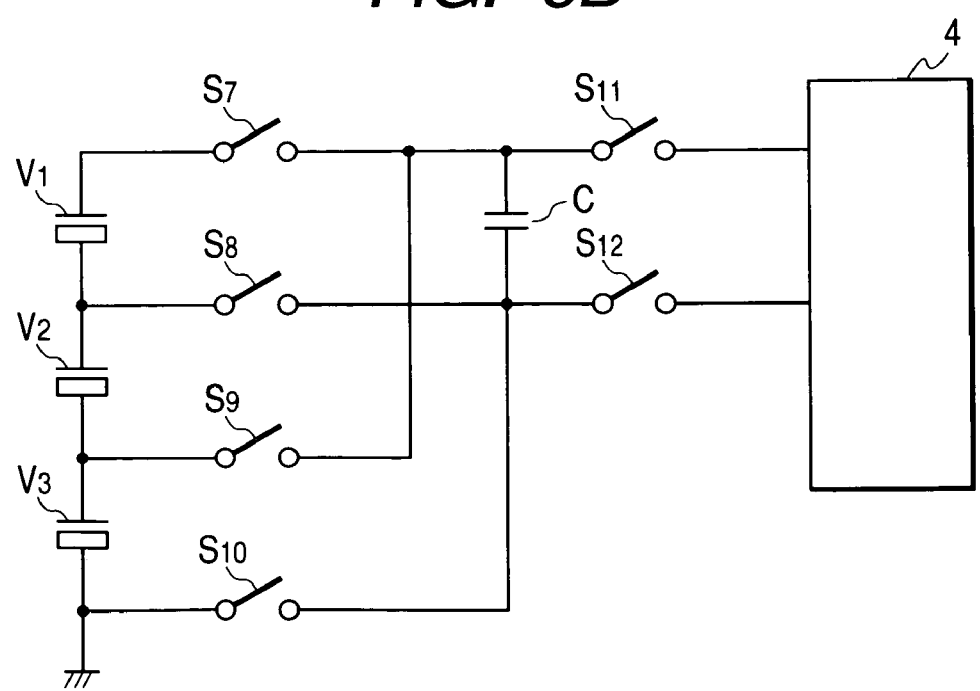
FIG. 6B is a circuit diagram showing an example of the flying capacitor type voltage detector.

In the first embodiment, the count pulse generation circuit 205 for counting predetermined time $T_1$ and the counter 206 are provided on the high voltage system circuit 200 side. However, in the third embodiment, it is possible to consider that the count pulse generation circuit 205 and the counter 206 are provided on the microcomputer 100 side as shown in FIG. 5. In this case, since counter processing can be conducted on the low voltage system circuit 100 side, the accuracy and reliability of measuring a voltage can be enhanced. In this connection, in the case shown in FIG. 5, the counter 206 is used in both the count pulse circuits 202 and 205.

In the first embodiment, the voltage across both terminals is detected according to time $T_2$ from when the integration of reference voltage $V_{refn}$ is started to when the integration value $\int V_{refn} dT$ becomes equal to the integration value $\int V_{IN} dT_1$ which is obtained when the voltage across both terminals $V_{IN}$ of unit cell $V_n$ is integrated for a predetermined period of time $T_1$. However, the same effect can be provided, for example, when the voltage across both terminals is detected according to time $T_2$ from when the integration of voltage $V_{IN}$ across both terminals of unit cell $V_n$ is started to when the integration value $\int V_{IN} dT$ becomes equal to the integration value $\int V_{refn} dT_1$ which is obtained when reference voltage $V_{refn}$ is integrated for a predetermined period of time $T_1$.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A voltage detector for a battery assembly having a plurality of unit cells which are connected to each other, the voltage detector comprising:
   a low voltage system circuit, which is supplied with electric power from a low voltage power source different from the battery assembly, the low voltage system circuit including:
   an enable pulse output unit, which outputs an enable pulse to command detection of a voltage across both terminals of a unit cell of the plurality of unit cells; and
   a high voltage system circuit, which is supplied with electric power from the battery assembly, the high voltage system circuit including:
   a voltage pulse output unit, which outputs a voltage pulse showing a voltage across both terminals of the unit cell of the plurality of unit cells;
   a switch, which is provided between each unit cell of the plurality of unit cells and the voltage pulse output unit; and
   a switch controller, which conducts ON-OFF control of the switch so that the each unit cell of the plurality of unit cells is successively connected to the voltage pulse output unit according to the enable pulse inputted from the enable pulse output unit,
   wherein the voltage pulse output unit outputs a voltage pulse for a period of time from a start of integration of one of a first voltage and a second voltage to when a first integration value of the one of the first and second voltages becomes equal to a second integration value obtained when the other of the one of the first and second voltages is integrated for a predetermined period of time,
   wherein the first voltage is a voltage across both terminals of the unit cell, and
   wherein the second voltage is a reference voltage.

2. The voltage detector as set forth in claim 1, wherein the voltage pulse output unit has an integration circuit to integrate an input voltage;
   wherein the switch changes the input voltage of the integration circuit between the first voltage and the second voltage which is a reverse polarity with respect to the first voltage;
   wherein the switch controller controls so as to inputs the other of the first and second voltages after inputting the one of the first and second voltages for a predetermined period of time; and
   wherein the voltage pulse output unit outputs the voltage pulse for the period of time from when the input of the integration circuit is changed from the one of the first and second voltages to the other of the first and second voltages to when an output of the integration circuit becomes equal to the output of the integration circuit before the one of the first and second voltages is inputted.

3. The voltage detector as set forth in claim 1, wherein the voltage pulse output unit outputs a voltage pulse of either level H or L for a period of time from when the input of the integration circuit is changed from the one of the first and second voltages to the other of the first and second voltages to when the output of the integration circuit becomes equal to the output of the integration circuit before one of the first and second voltages is inputted; and
   wherein the low voltage system circuit further includes a count pulse generator which generates a count pulse while the voltage pulse of either level H or L is outputted.

4. The voltage detector as set forth in claim 1, wherein the high voltage system circuit further includes a counter which counts the predetermined period of time.

5. A voltage detector for a battery assembly having a plurality of unit cells which are connected to each other, the voltage detector comprising:
   a detector, which detects a voltage across both terminals of the unit cell for a period of time from a start of integration of one of a first voltage and a second voltage to when a first integration value of the one of the first and second voltages becomes equal to a second integration value obtained when the other of the first and second voltages is integrated for a predetermined period of time,
   wherein the first voltage is a voltage across the both terminals of the unit cell; and
   wherein the second voltage is a reference voltage.

6. The voltage detector as set forth in claim 5, further comprising: an integration circuit, which integrates an input voltage;
   a switch, which changes the input voltage of the integration circuit between the first voltage and the second voltage which is a reverse polarity with respect to the first voltage; and
   a switch controller, which controls so as to change the input between the first voltage and the second voltage,
   wherein the switch controller changes the one of the first and second voltages to the other of the first and second voltages after the one of the first and second voltages is inputted for a predetermined period of time; and
   wherein the first voltage is detected for a period of time from when the one of the first and second voltages is changed to the other of the first and second voltages to when the output of the integration circuit becomes equal to the output of the integration circuit before the one of the first and second voltages is inputted.

* * * * *